US010331601B2

(12) United States Patent
Narippatta et al.

(10) Patent No.: US 10,331,601 B2
(45) Date of Patent: Jun. 25, 2019

(54) SYSTEMS, APPARATUS, AND METHODS FOR EFFICIENT SPACE TO TIME CONVERSION OF OTU MULTIPLEXED SIGNAL

(71) Applicant: Infinera Corporation, Annapolis Junction, MD (US)

(72) Inventors: Vinod Narippatta, Bangalore (IN); Unnikrishnan C V, Sunnyvale, CA (US); Sanjay Kamat, Bangalore (IN); Ashok Jain, Bangalore (IN); Ashok Tatineni, Bangalore (IN); Vishwanathan Paramasivam, Bangalore (IN)

(73) Assignee: Infinera Corporation, Sunnyvale, CA (US)

( * ) Notice: Subject to any disclaimer, the term of this patent is extended or adjusted under 35 U.S.C. 154(b) by 103 days.

(21) Appl. No.: 15/249,341

(22) Filed: Aug. 26, 2016

(65) Prior Publication Data
US 2017/0300443 A1    Oct. 19, 2017

Related U.S. Application Data

(60) Provisional application No. 62/323,246, filed on Apr. 15, 2016, provisional application No. 62/323,199, filed on Apr. 15, 2016.

(51) Int. Cl.
| G06F 13/40 | (2006.01) |
| G06F 13/16 | (2006.01) |
| G11C 7/10  | (2006.01) |
| G06F 12/02 | (2006.01) |

(52) U.S. Cl.
CPC ........ *G06F 13/4022* (2013.01); *G06F 12/023* (2013.01); *G06F 13/1668* (2013.01); *G11C 7/1012* (2013.01); *G06F 2212/251* (2013.01)

(58) Field of Classification Search
None
See application file for complete search history.

(56) References Cited

U.S. PATENT DOCUMENTS

| 6,272,567 | B1 * | 8/2001 | Pal | ........ G11C 7/1006 710/2 |
| 7,653,806 | B2 * | 1/2010 | Hansen | ........ G06F 9/30014 712/37 |
| 8,686,549 | B2 * | 4/2014 | Vorbach | ........ G06F 9/30036 257/686 |

(Continued)

*Primary Examiner* — Michael Sun
(74) *Attorney, Agent, or Firm* — David L. Soltz

(57) ABSTRACT

Methods and apparatuses for data transformation are disclosed. An exemplary apparatus includes a first memory, a second memory, a cross-bar switch communicatively coupled between the first memory and the second memory, and a lookup table that specifies one or more memory addresses of the first memory to read out to the cross-bar switch, one or more memory addresses of the second memory to which to write data from the cross-bar switch, and a configuration of the cross-bar switch. An exemplary method includes determining, based on a lookup table, one or more memory addresses of a first memory to read out to a cross-bar switch, determining, based on the lookup table, one or more memory addresses of a second memory to which to write data from the cross-bar switch, and determining, based on the lookup table, a configuration of the cross-bar switch.

20 Claims, 11 Drawing Sheets

(56) References Cited

U.S. PATENT DOCUMENTS

| | | | |
|---|---|---|---|
| 2009/0113185 A1* | 4/2009 | Hansen | G06F 9/4484 712/221 |
| 2012/0131257 A1* | 5/2012 | Rudosky | G06F 15/7867 711/5 |
| 2013/0125097 A1* | 5/2013 | Ebcioglu | G06F 17/5045 717/136 |
| 2014/0254232 A1* | 9/2014 | Wu | G11C 5/06 365/72 |

* cited by examiner

SYSTEMS, APPARATUS, AND METHODS FOR EFFICIENT SPACE TO TIME CONVERSION OF OTU MULTIPLEXED SIGNAL

CLAIM OF PRIORITY UNDER 35 U.S.C. § 120

The present Application for Patent claims priority to provisional U.S. Patent Application No. 62/323,246, entitled "STRUCTURES FOR GENERIC DATA TRANSFORMATION," filed Apr. 15, 2016, assigned to the assignee hereof, and provisional U.S. Patent Application No. 62/323,199, entitled "SYSTEMS, APPARATUS, AND METHODS FOR EFFICIENT SPACE TO TIME CONVERSION OF OTU MULTIPLEXED SIGNAL," filed Apr. 15, 2016, assigned to the assignee hereof, both expressly incorporated herein by reference in their entirety.

FIELD OF DISCLOSURE

This disclosure relates generally to optical communication networks and more specifically, but not exclusively, to space to time conversion of multiplexed signals in packet optical communication networks.

BACKGROUND

An Optical Transport Network (OTN) is a set of Optical Network Elements (ONE) connected by optical fiber links, able to provide the functionality of transport, multiplexing, switching, management, supervision and survivability of optical channels carrying client signals. OTN was designed to provide support for optical networking using wavelength-division multiplexing (WDM). ITU-T Recommendation G.709 is commonly called Optical Transport Network (OTN) (also called digital wrapper technology or optical channel wrapper). The ITU's Optical Transport Network (OTN), as defined by recommendation G.709, provides a network-wide framework that adds SONET/SDH-like features to WDM equipment (also known as Wavelength Switched Optical Network equipment, or WSON equipment). It creates a transparent, hierarchical network designed for use on both WDM/WSON devices and TDM devices. Two switching layers are formed (TDM and WSON) and functions of transport, multiplexing, routing, management, supervision, and survivability are defined. As of December 2009 OTN has standardized the line rates using Optical Transport Unit (OTU) frames, OTUk (k=1/2/2e/3/3e2/4). The OTUk is an information structure into which another information structure called Optical Data Unit (ODU) k (k=1/2/2e/3/3e2/4) is mapped. The ODUk signal is the server layer signal for client signals. At a basic level, G.709 OTN defines a frame format that "wraps" data packets, in a format quite similar to that of a SONET frame. There are six distinct layers to this format.

OPU: Optical Channel Payload Unit. This contains the encapsulated client data, and a header describing the type of that data. It is analogous to the 'Path' layer in SONET/SDH.

ODU: Optical Data Unit. This level adds optical path-level monitoring, alarm indication signals and automatic protection switching. It performs similar functions to the 'Line Overhead' in SONET/SDH.

OTU: Optical Transport Unit. This represents a physical optical port (such as OTU2, 10 Gbps), and adds performance monitoring (for the optical layer) and the FEC (Forward Error Correction). It is similar to the 'Section Overhead' in SONET/SDH.

OCh: Optical Channel. This represents an end-to-end optical path.

OMS: Optical Multiplex Section. This deals with fixed wavelength DWDM (Dense Wavelength Division Multiplexing) between OADMs (Optical Add Drop Multiplexer).

OTN transport and switching solutions need the capability to process lower order ODUs individually. Several lower order ODUs are time multiplexed into a higher order ODU using standard multiplexing procedure recommended in ITU G.709. For example, an OTU4 signal can potentially carry 80 multiplexed flows of lower level ODU0 signals. As this signal is transported in an OTN network, it becomes necessary to observe and process the lower order ODU signal to meet the operation, administration, and management requirements of the network.

The transformation of signals from one form to another (e.g., data interleaving, space to time, etc.) is common in many datapath designs in the telecommunications field. These are generally area and power intensive, and the complexity of their implementation increases non-linearly with increasing data rates.

More specifically, in many designs, certain blocks of the datapath might handle data in a context-switched fashion, while other blocks of the datapath might handle data on an independent per-flow basis. A "context-switched fashion" and an "independent per-flow basis" refer to design options that serve multiple contexts at a time. For example, given 10 client flows that are to be processed, there are two options for processing the client flows. The first option is to have 10 processing engines, one for each flow, that are running at the rate required to process a flow. This is referred to as processing on an "independent per-flow basis." The second option is to have a single processing engine that can process at 10 times the speed required to process the client flows and which can be time-sliced so that each flow would get a turn for the required processing. This option is referred to as processing in a "context-switched-fashion."

The datapath uses space-to-time transformations at the interface of such blocks. Traditional space-to-time transformations have been designed using large multiplexers and delay elements. However, these designs do not scale well due to the increasing data rate and the subsequent increase of data-bus widths (these increase the power/area considerations). The number of flows that need to be independently supported is also increasing, which adds another dimension of complexity to the design of the datapath.

These issues are preventing such functions from being implemented in even the largest of the present generation of field programmable gate arrays (FPGAs) and necessitate a better design. For example, FPGAs that process data at rates of 100 gigabytes per second (gbps) and above, may be larger and consume significantly more power than FPGAs currently operating at lower data rates.

Accordingly, there is a need for systems, apparatus, and methods that improve upon conventional approaches including the improved methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An apparatus for data transformation includes a first memory, a second memory, a cross-bar switch communicatively coupled between the first memory and the second memory, and a lookup table that specifies one or more memory addresses of the first memory to read out to the cross-bar switch, one or more memory addresses of the second memory to which to write data from the cross-bar switch, and a configuration of the cross-bar switch.

A method for data transformation includes determining, based on a lookup table, one or more memory addresses of a first memory to read out to a cross-bar switch, determining, based on the lookup table, one or more memory addresses of a second memory to which to write data from the cross-bar switch, and determining, based on the lookup table, a configuration of the cross-bar switch, wherein the cross-bar switch is communicatively coupled between the first memory and the second memory.

A non-transitory computer-readable medium for data transformation includes a lookup table configured to: store one or more memory addresses of a first memory to read out to a cross-bar switch, store one or more memory addresses of a second memory to which to write data from the cross-bar switch, and store a configuration of the cross-bar switch, wherein the cross-bar switch is communicatively coupled between the first memory and the second memory.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
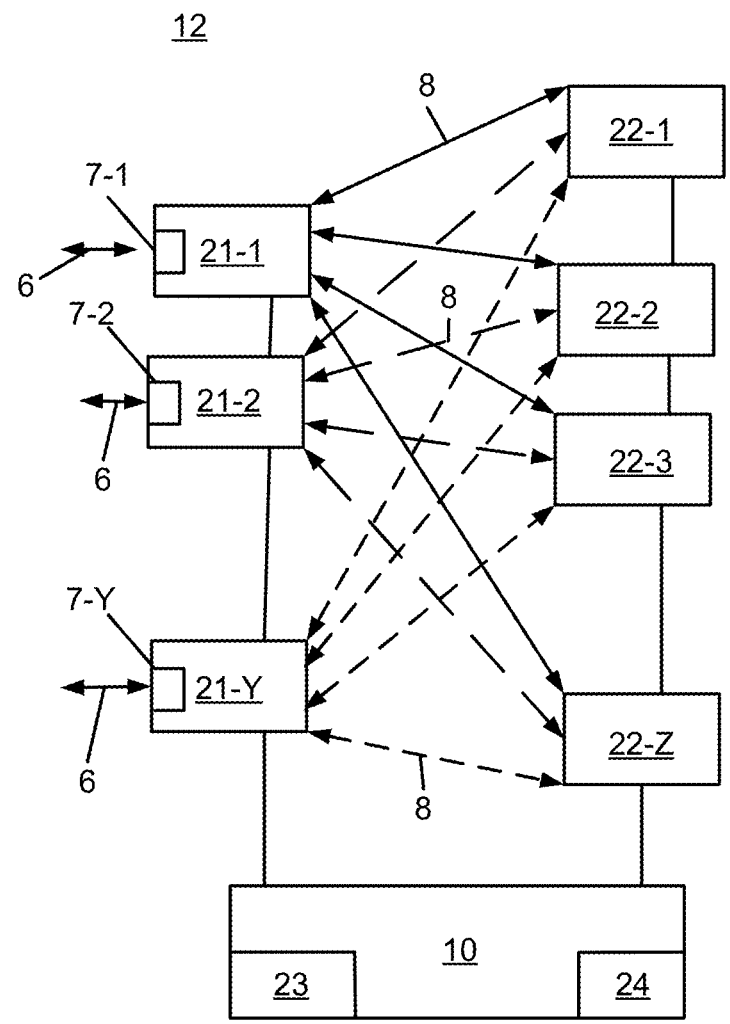
FIG. 1A illustrates an exemplary node of a network in accordance with some examples of the disclosure. in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the industry needs, as well as other previously unidentified needs, and mitigate shortcomings of the conventional methods, apparatus, and systems. For example, methods and apparatuses for data transformation are disclosed. An exemplary apparatus includes a first memory, a second memory, a cross-bar switch communicatively coupled between the first memory and the second memory, and a lookup table that specifies one or more memory addresses of the first memory to read out to the cross-bar switch, one or more memory addresses of the second memory to which to write data from the cross-bar switch, and a configuration of the cross-bar switch. An exemplary method includes determining, based on a lookup table, one or more memory addresses of a first memory to read out to a cross-bar switch, determining, based on the lookup table, one or more memory addresses of a second memory to which to write data from the cross-bar switch, and determining, based on the lookup table, a configuration of the cross-bar switch. An exemplary non-transitory computer-readable medium for data transformation includes a lookup table configured to: store one or more memory addresses of a first memory to read out to a cross-bar switch, store one or more memory addresses of a second memory to which to write data from the cross-bar switch, and store a configuration of the cross-bar switch.

FIG. 1A is a diagram of exemplary components of node 12. As shown in FIG. 1A, node 12 may include a controller 10 configurable to control the operation of the node 12 including connection admission (e.g. a software defined networking controller capable of connection admission control), line cards or modules 21-1, 21-2 to 21-Y (referred to collectively as "line modules 21," and individually as "line module 21") (where Y>=1) connected to switching planes 22-1, 22-2 to 22-Z (referred to collectively as "switching planes 22," and individually as "switching plane 22") (where Z>=1). Controller 10 may be an application, such as in a SDN, that manages flow control to enable intelligent networking. Controller 10 may be based on protocols, such as OpenFlow, that allow servers to tell switches (e.g. node 12) where to send packets (e.g. packet 417). The controller 10 may logically lie between network devices (e.g. node 12) at one end and applications at the other end. Controller 10 may be configured such that communications between applications and devices (e.g. node 12) have to go through the controller 10. The controller 10 may include a logic circuit 23 and a memory 24 configured to uses protocols such as OpenFlow to configure network devices and choose the optimal network path (e.g. first path 460 or second path 470) for application traffic. In effect, the controller 10 may be configured to serve as a sort of operating system for the network 16. By taking the control plane off the network hardware and running it as software instead, the controller 10 may facilitate automated network management and makes it easier to integrate and administer business applications. OpenFlow is a programmable network protocol designed to manage and direct traffic among routers and switches from various vendors. It separates the programming of routers and switches from underlying hardware. OpenFlow may consists of three parts: flow tables installed on switches (e.g. node 12), a controller 10 and a proprietary OpenFlow protocol for the controller 10 to talk securely with switches 12. Flow tables are set up on switches 12. Controller 10 talks to the switches 12 via the OpenFlow protocol and impose policies on flows. The controller 10 could set up paths through the network optimized for specific characteristics, such as speed, fewest number of hops or reduced latency.

While FIG. 1A shows a particular number and arrangement of components, node 12 may include additional, fewer, different, or differently arranged components than those illustrated in FIG. 1A. Also, it may be possible for one of the components of node 12 to perform a function that is described as being performed by another one of the components. Node 12 may configured as a TDM capable optical switch, a router, a reconfigurable optical add/drop multiplexer (ROADM) such as Infinera's DTN-X packet optical transport capable switch, Infinera's EMXP packet-optical transport switch, or similar device configurable to provide Carrier Ethernet services. Node 12 may also be referred to as a device, such as a first device, a second device etc. The line module 21 may be configured as a packet switching module, such as Infinera's PXM module, that supports switching of VLAN tagged packets into ODUFlex or ODU2e circuits. This allows the node 12 to dynamically switch IP/MPLS router traffic over an OTN network using the VLAN label ID to the destination device. This may enable packet switching functionality over an OTN network with maximum network efficiency and scalability by combining the benefits of device bypass with standardized ODU0 level multi-service grooming and switching.

Line module 21 may include hardware components such as one or more ports 7-1, 7-2 to 7-Y, or a combination of hardware and software components, that may provide network interface operations. Line module 21 may receive a multi-wavelength optical signal 6 and/or transmit a multi-wavelength optical signal 6 at the ports 7. A multi-wavelength optical signal 6 may include a number of optical signals of different optical wavelengths. In one implementation, line module 21 may perform retiming, reshaping, regeneration, time division multiplexing, and/or recoding services for each optical wavelength signal 6.

Switching plane 22 may include hardware components, or a combination of hardware and software components, that may provide switching functions to transfer data between line modules 21. In one implementation, switching plane 22 may provide fully non-blocking transfer of data. As to be explained below, switching plane 22 may be programmed to transfer data from a particular input port 6 to a particular output port 6.

As shown in FIG. 1A, each of line modules 21 may connect to each of switching planes 22 with a plurality of connections 8. The connections 8 between line modules 21 and switching planes 22 may be bidirectional. While a single connection 8 is shown between a particular line module 21 and a particular switching plane 22, the connection 8 may include a pair of unidirectional connections (i.e., one in each direction). A connection 8 from a line module 21 to a switching plane 22 will be referred to herein as an "ingress switch link," and a connection 8 from a switching plane 22 to a line module 21 will be referred to as an "egress switch link."

Figure 1B:
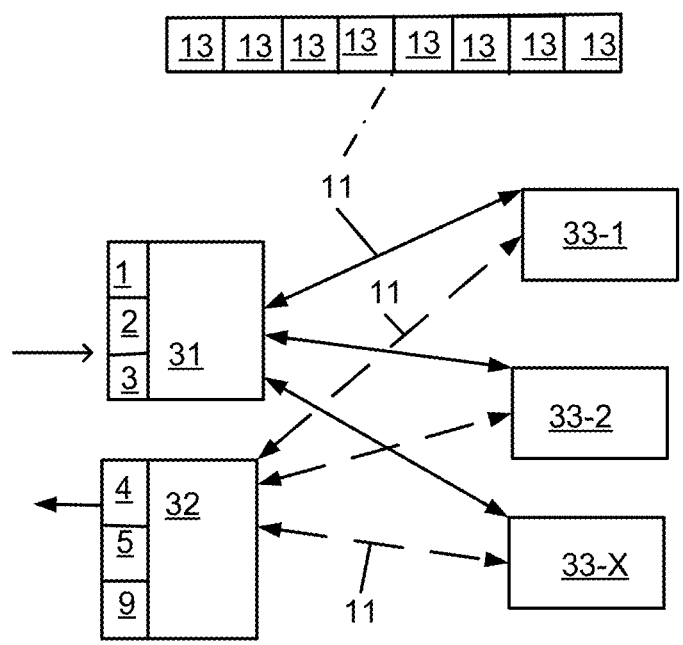
FIG. 1B illustrates an exemplary line module of the node in FIG. 1A in accordance with some examples of the disclosure.

FIG. 1B is a diagram of exemplary components of a line module 21. As shown in FIG. 1B, line module 21 may include a receiver (RX) photonic integrated circuit (PIC) 31 (e.g. a port 7-1), a transmitter (TX) PIC 32 (e.g. a port 7-2), and fabric managers (FMs) 33-1, 33-2 to 33-X (referred to collectively as "FMs 33," and individually as "FM 33") (where X>=1). While FIG. 1B shows a particular number and arrangement of components, line module 21 may include additional, fewer, different, or differently arranged components than those illustrated in FIG. 1B. Also, it may be possible for one of the components of line module 21 to perform a function that is described as being performed by another one of the components.

Receiver PIC 31 may include hardware, or a combination of hardware and software, that may receive a multi-wavelength optical signal 6, separate the multi-wavelength signal 6 into signals of individual wavelengths, and convert the signals 6 to electrical (i.e. digital or analog) signals 11. In one implementation, receiver PIC 31 may include components, such as a photodetector 1, a demultiplexer 2, and/or an optical-to-electrical converter 3. Transmitter PIC 32 may include hardware, or a combination of hardware and software, that may convert signals 11 from digital form into a multi-wavelength optical signal 6, and transmit the multi-wavelength signal 6. In one implementation, transmitter PIC 32 may include components, such as an electrical-to-optical converter 4, a multiplexer 5, and/or a laser 9. As shown in FIG. 1B, receiver PIC 31 and transmitter PIC 32 may connect to each of FMs 33. Receiver PIC 31 may transfer signals 11 to FMs 33. Transmitter PIC 32 may receive signals 11 from FMs 33.

FM 33 may include hardware, or a combination of hardware and software, that may process digital signals 11 for transmission to switching plane 22 or transmitter PIC 32. In one implementation, FM 33 may receive a stream of signals 11 from receiver PIC 31 and divide the stream into time slots 13. In one implementation, each time slot 13 may include the same quantity of bytes (e.g., each time slot 13 may contain an equal amount of bandwidth). In another implementation, each time slot 13 may not include the same quantity of bytes (e.g., at least one time slot may contain a different amount of bandwidth). The stream of signals 11 received by FM 33 may, in one implementation, already be segmented into time slots 13, for example when the multi-wavelength optical signal 6 is received already divided into time slots 13. In this situation, when dividing the signals 11 into time slots 13, FM 33 may identify the time slots 13 based on, for examples, identifiers in the signals 11.

In one implementation, the quantity of time slots 13 may equal the quantity of switches available in switching planes 22. Assume, for example, that there are sixteen switches available in switching planes 22. In this case, FM 33 may divide the signals 11 into sixteen equal time slots 13. FM 33 may send each of the time slots 13 to a different one of the switches. In one implementation, FM 33 may sequentially send each of the time slots 13 in a round robin fashion. In another implementation, FM 33 may send out each of the time slots 13 in another systematic fashion.

Figure 1C:
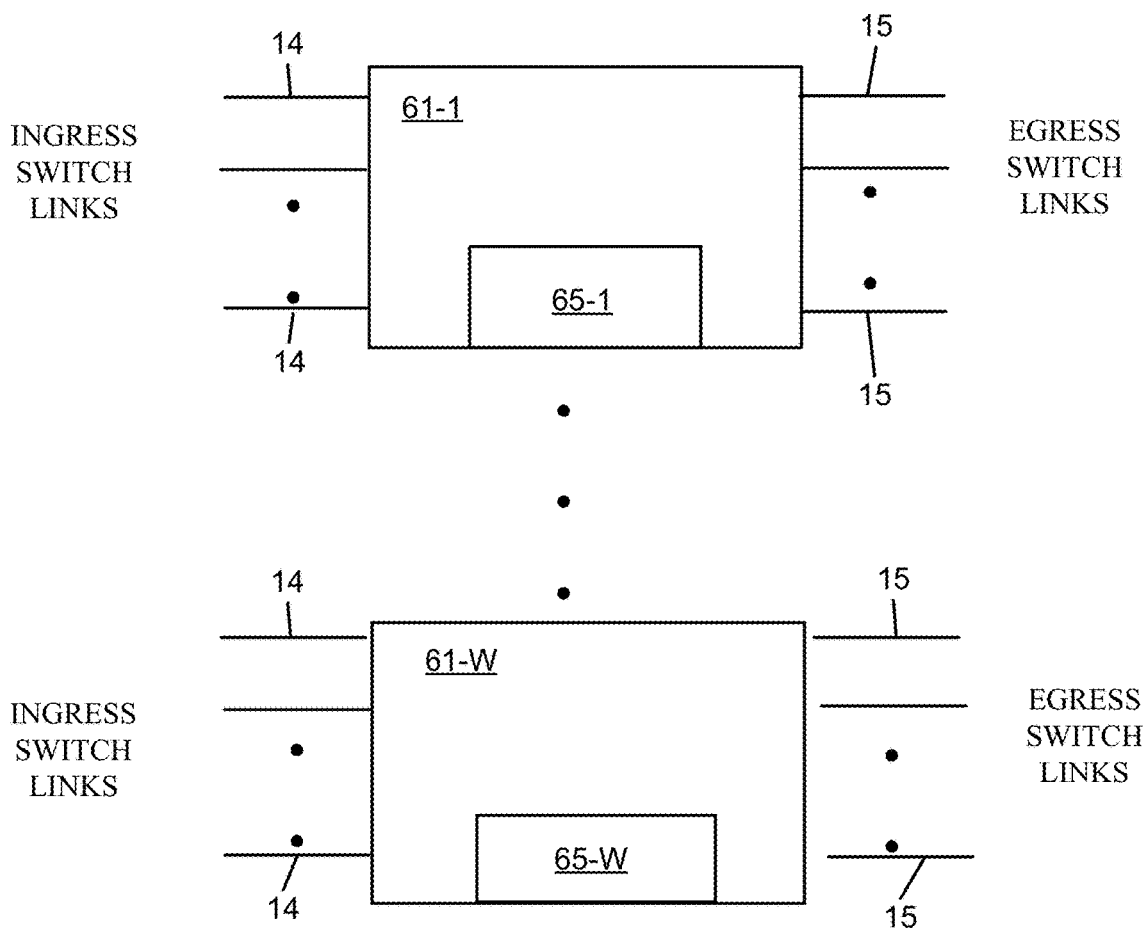
FIG. 1C illustrates an exemplary switch of the node in FIG. 1A in accordance with some examples of the disclosure.

FIG. 1C is a diagram of exemplary components of a switching plane 22. As shown in FIG. 1C, switching plane 22 may include switches 61-1 to 61-W (referred to collectively as "switches 61," and individually as "switch 61") (where W>=1). While FIG. 1C shows a particular number and arrangement of components, switching plane 22 may include additional, fewer, different, or differently arranged components than those illustrated in FIG. 1C. Also, it may be possible for one of the components of switching plane 22 to perform a function that is described as being performed by another one of the components.

Switch 61 may include hardware, or a combination of hardware and software, that may transfer a received time slot 13 on an ingress switch link 14 to a time slot 13 on an egress switch link 15, where the time slot 13 on the ingress switch link 14 may differ from the time slot 13 on the egress switch link 15. Switch 61 may include a set of ingress switch links 14 via which time slots 13 are received, and a set of egress switch links 15 via which time slots 13 are transmitted. Each ingress switch link 14 and egress switch link 15 may connect to a particular FM 33.

Switch 61 may include a configuration database 65. Configuration database 65 may store mapping information that instructs switch 61 on which egress switch link 15 and in what time slot 13 to send a block of data received within a particular time slot 13 on a particular ingress switch link 14 along with information on what port 7 to use. The mapping information may be programmed by an operator of node 12 on a per node 12 basis, and may remain fixed until changed by the operator. Alternatively, the mapping information may be programmed under the control of a network-level routing and signaling algorithm, and may remain fixed until changed by the algorithm. In one implementation, each of switches 61 may store identical mapping information. In other words, each of switches 61 may be programmed to map time slot A on its ingress switch link B to time slot C on its egress switch link D.

In one implementation, configuration database 65 may store the mapping information in the form of a table, such as provided below.

| Egress Switch Link 15 | Egress Time slot 13 | Ingress Switch Link 14 | Ingress Time slot 13 |
|---|---|---|---|
| #8 | #14 | #1 | #10 |

This information may identify an ingress switch link 14 and ingress time slot 13 (e.g., a time slot 13 on the ingress switch link 14) for each egress switch link 15 and egress time slot 13 (e.g., a time slot 13 on the egress switch link 15). As shown, for example, the mapping information may map time slot #10 on ingress switch link #1 to time slot #14 on egress switch link #8.

Figure 1D:
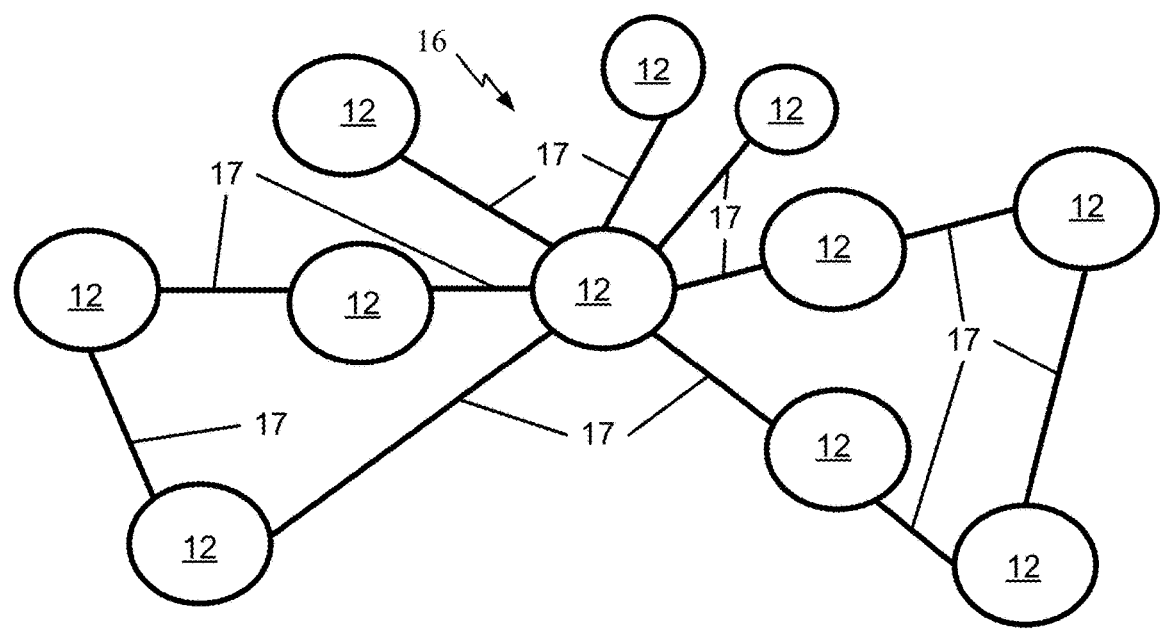
FIG. 1D illustrates an exemplary network configuration of the nodes in FIG. 1A in accordance with some examples of the disclosure.

FIG. 1D illustrates an exemplary network configuration of the nodes in FIG. 1A in accordance with some examples of the disclosure. As shown in FIG. 1D, an optical network 16 may include a plurality of nodes 12 interconnected by a plurality of connections 17. Each of the plurality of connections 17 may be configured to transport a plurality of multi-wavelength optical signals 6 having a plurality of time slots 13 or in another format. Each of the plurality of connections 17 may be, for example, a unidirectional or bi-direction medium such as an optical fiber capable of transporting an optical signal 6 or an electrical signal 11. The following examples describe apparatus and methods for use in conjunction with node 12.

The examples herein may be used in conjunction with the node 12 (including the controller 10) described in FIGS. 1A-1D. As noted above, the transformation of signals from one form to another (e.g., data interleaving, space to time, etc.) is common in many datapath designs in the telecommunications field. These are generally area and power intensive, and the complexity of their implementation increases non-linearly with increasing data rates. For example, at 100 gigabytes per second (gbps) and above, these power and area considerations are leading designers to explore new efficient implementations that will enable cost-effective solutions.

As will be described further herein, the present disclosure uses a set of memory arrays combined with a cross-bar switch and a memory access scheme to enable these signal transformations in a generic, scalable, and power and area efficient fashion. Namely, instead of including multiples switches, for example, to carry out signal transformations on multiple data streams, data from each stream is stored in a memory, and read out for processing by a switch in a controlled manner that avoids read/write conflicts in the memory. Accordingly, fewer switching elements, for example, are required such that FPGAs for processing the data streams may be made smaller and consume less power compared to implementations in which switches or processing elements are provided for each data stream. Memory address generation can be done in the software and programmed into the chip to further reduce the area and complexity. The disclosure also enables seamless handling of multiple flows or streams without any further increase to complexity or cost.

As is known in the art, a cross-bar switch is a collection of switches arranged in a matrix configuration. A cross-bar switch has multiple input and output lines, or "bars," that form a crossed pattern of interconnecting lines. At each cross-point, a pass transistor is implemented that connects the lines. When the pass transistor is enabled, the input is connected to the output. Note that this is not necessarily true of all cross-bar switches. For example, in an ASIC, this is implemented more like a multiplexer that can select one of the many inputs as the output.

Figure 2:
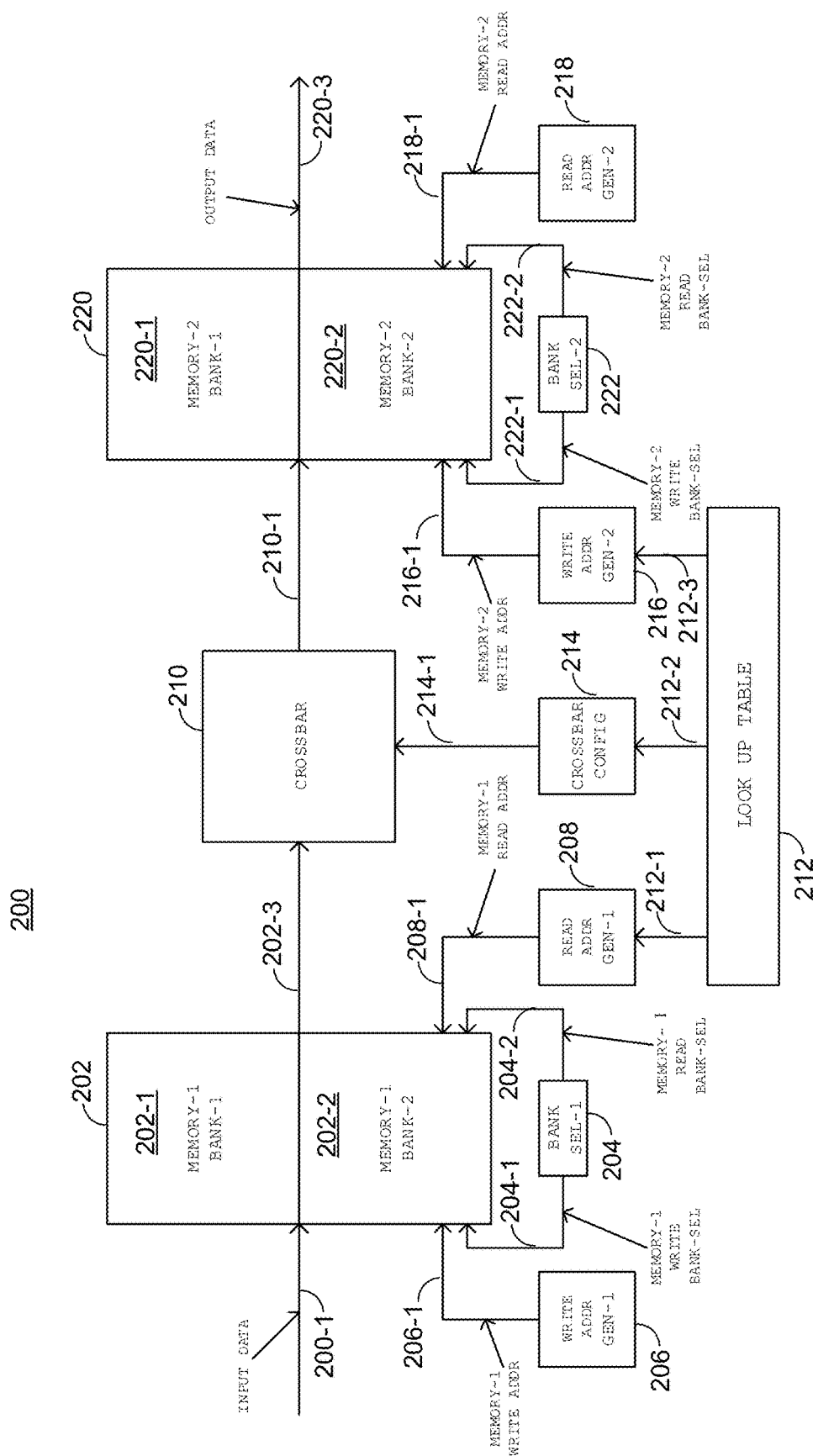
FIG. 2 illustrates exemplary components of a system for generic data transformation in accordance with some examples of the disclosure.

The disclosed structures for generic data transformation may, for example, be used in conjunction with the devices described in FIGS. 1A-1D. For example, FIG. 2 illustrates exemplary components of a system 200 for generic data transformation in accordance with some examples of the disclosure that may be incorporated into the node 12 of FIG. 1A.

The system 200 includes a first memory 202 (referred to as "MEMORY-1") that includes a first memory bank 202-1 (referred to as "BANK-1") and a second memory bank 202-2 (referred to as "BANK-2"). A first memory bank selector 204 (referred to as "BANK SEL-1") outputs a first write transaction memory bank selector signal 204-1 (referred to as "MEMORY-1 WRITE BANK-SEL") to the first memory 202 to select either the first memory bank 202-1 or the second memory bank 202-1 for a write transaction. The first memory bank selector 204 outputs a first read transaction memory bank selector signal 204-2 (referred to as "MEMORY-1 READ BANK-SEL") to the first memory 202 to select either the first memory bank 202-1 or the second memory bank 202-2 for a read transaction. A first write address generator 206 (referred to as "WRITE ADDR GEN-1") outputs a first memory write address signal 206-1 (referred to as "MEMORY-1 WRITE ADDR") to the first memory 202 to select the one or more memory addresses in the first memory bank 202-1 or the second memory bank 202-2 to which data for the write transaction should be written. A first read address generator 208 (referred to as "READ ADDR GEN-1") outputs a first memory read address signal 208-1 (referred to as "MEMORY-1 READ ADDR") to the first memory 202 to select the one or more addresses in the first memory bank 202-1 or the second memory bank 202-2 from which data for the read transaction should be read.

In general, the first memory bank selector 204 will select either the first memory bank 202-1 or the second memory bank 202-2 for read transactions and the other of the first memory bank 202-1 and the second memory bank 202-2 for write transactions. The first write address generator 206 then generates the first memory write address signal 206-1 for the selected one of the first memory bank 202-1 or the second memory bank 202-2, and the first read address generator 208 generates the first memory read address signal 208-1 for the other of the first memory bank 202-1 and the second memory bank 202-2. Thus, for example, if the first read transaction memory bank selector signal 204-2 selects the first memory bank 202-1 for read transactions and the first write transaction memory bank selector signal 204-1 selects the second memory bank 202-2 for write transactions, the first write address generator 206 will generate the first memory write address signal 206-1 for the second memory bank 202-2 and the first read address generator 208 will generate the first memory read address signal 208-1 for the first memory bank 202-1.

The system 200 further includes a second memory 220 (referred to as "MEMORY-2") that includes a first memory bank 220-1 (referred to as "BANK-1") and a second memory bank 220-2 (referred to as "BANK-2"). A second memory bank selector 222 (referred to as "BANK SEL-2") outputs a second write transaction memory bank selector signal 222-1 (referred to as "MEMORY-2 WRITE BANK-SEL") to the second memory 220 to select either the first memory bank 220-1 or the second memory bank 220-2 for write transactions. The second memory bank selector 222 outputs a second read transaction memory bank selector signal 222-2 (referred to as "MEMORY-2 READ BANK-SEL") to the second memory 220 to select either the first memory bank 220-1 or the second memory bank 220-1 for read transactions. A second write address generator 216 (referred to as "WRITE ADDR GEN-2") outputs a second memory write address signal 216-1 (referred to as "MEMORY-2 WRITE ADDR") to the second memory 220 to select the one or more addresses in the first memory bank 220-1 or the second memory bank 220-2 to which data for the write transaction should be written. A second read address generator 218 (referred to as "READ ADDR GEN-2") outputs a second memory read address signal 218-1 (referred to as "MEMORY-2 READ ADDR") to the second memory 220 to select the one or more addresses in the first memory bank 220-1 or the second memory bank 220-2 from which data for the read transaction should be read.

In general, the second memory bank selector 222 will select either the first memory bank 220-1 or the second memory bank 220-2 for read transactions and the other of the first memory bank 220-1 and the second memory bank 220-2 for write transactions. The second write address generator 216 then generates the second memory write address signal 216-1 for the selected one of the first memory bank 220-1 or the second memory bank 220-2, and the second read address generator 218 generates the second memory read address signal 218-1 for the other of the first memory bank 220-1 and the second memory bank 220-2. Thus, for example, if the second read transaction memory bank selector signal 222-2 selects the first memory bank 220-1 for read transactions and the second write transaction memory bank selector signal 222-1 selects the second memory bank 220-2 for write transactions, the second write address generator 216 will generate the second memory write address signal 216-1 for the second memory bank 220-2 and the second read address generator 218 will generate the second memory read address signal 218-1 for the first memory bank 220-1.

The first memory 202 receives input data 200-1 and, based on the first write transaction memory bank selector signal 204-1 and the first memory write address signal 206-1, writes the input data 200-1 to the specified address(es) in either the first memory bank 202-1 or the second memory bank 202-2. In an aspect, the input data 200-1 is written sequentially into the first memory 202 as it arrives. Based on the first read transaction memory bank selector signal 204-2 and the first memory read address signal 208-1, the first memory 202 outputs data 202-3 to a cross-bar switch 210 communicatively coupled between the first memory 202 and the second memory 220. The data 202-3 is read out of the first memory 202 based on how the lookup table 212 is programmed. Specifically, the first read address generator 208 generates the first memory read address signal 208-1 based on a read address signal 212-1 read out from the lookup table 212.

The cross-bar switch 210 distributes the data 202-3 to the second memory 220 as data 210-1 based on the how the lookup table 212 is programmed. Specifically, a cross-bar configuration component 214 outputs a cross-bar configuration signal 214-1 to the cross-bar switch 210 to route the data into the correct slot of the second memory 220 based on a configuration signal 212-2 read out from the lookup table 212. The second memory 220 receives the data 210-1 from the cross-bar switch 210 as input and, based on the second write transaction memory bank selector signal 222-1 and the second memory write address signal 216-1, writes the input data 210-1 to the specified address in either the first memory bank 220-1 or the second memory bank 220-2. The data 210-1 is written to the memory 220 based on how the lookup table 212 is programmed. Specifically, the second write address generator 216 generates the second memory write address signal 216-1 based on a write address signal 212-3 read out from the lookup table 212. Based on the second read transaction memory bank selector signal 222-2 and the second memory read address signal 218-1, the second memory 220 outputs data 220-3. The data 220-3 is read out sequentially from the second memory 220.

In an aspect, both the first memory 202 and the second memory 220 may be implemented as dual port memories, with a single read port and a single write port. The first memory 202 and the second memory 220 may be logically divided into two equal memory banks, i.e., the first memory bank 202-1 and the second memory bank 202-2 and the first memory bank 220-1 and the second memory bank 220-2. The bank-select logic (i.e., the first memory bank selector 204 and the second memory bank selector 222) ensures that when a first memory bank (e.g., the first memory bank 202-1) is being written, the second memory bank (e.g., the second memory bank 202-2) is being read, and vice-versa.

Advantages of the system 200 include a reduction in complexity by separating the data path (e.g., 200-1, 202-3, 210-1, 220-3) and the control path (e.g., 204-1, 204-2, 206-1, 208-1, 212-1, 212-2, 212-3, 214-1, 216-1, 218-1, 222-1, 222-2, etc.), allowing for implementation of the control path in software, and allowing for dynamic reconfiguration by reprogramming of the lookup table 212. Note that the lookup table 212 is implemented as a memory with write/read ports. As such, the software can write into the lookup table 212 using the write port, thereby reprogramming it.

Figure 3:
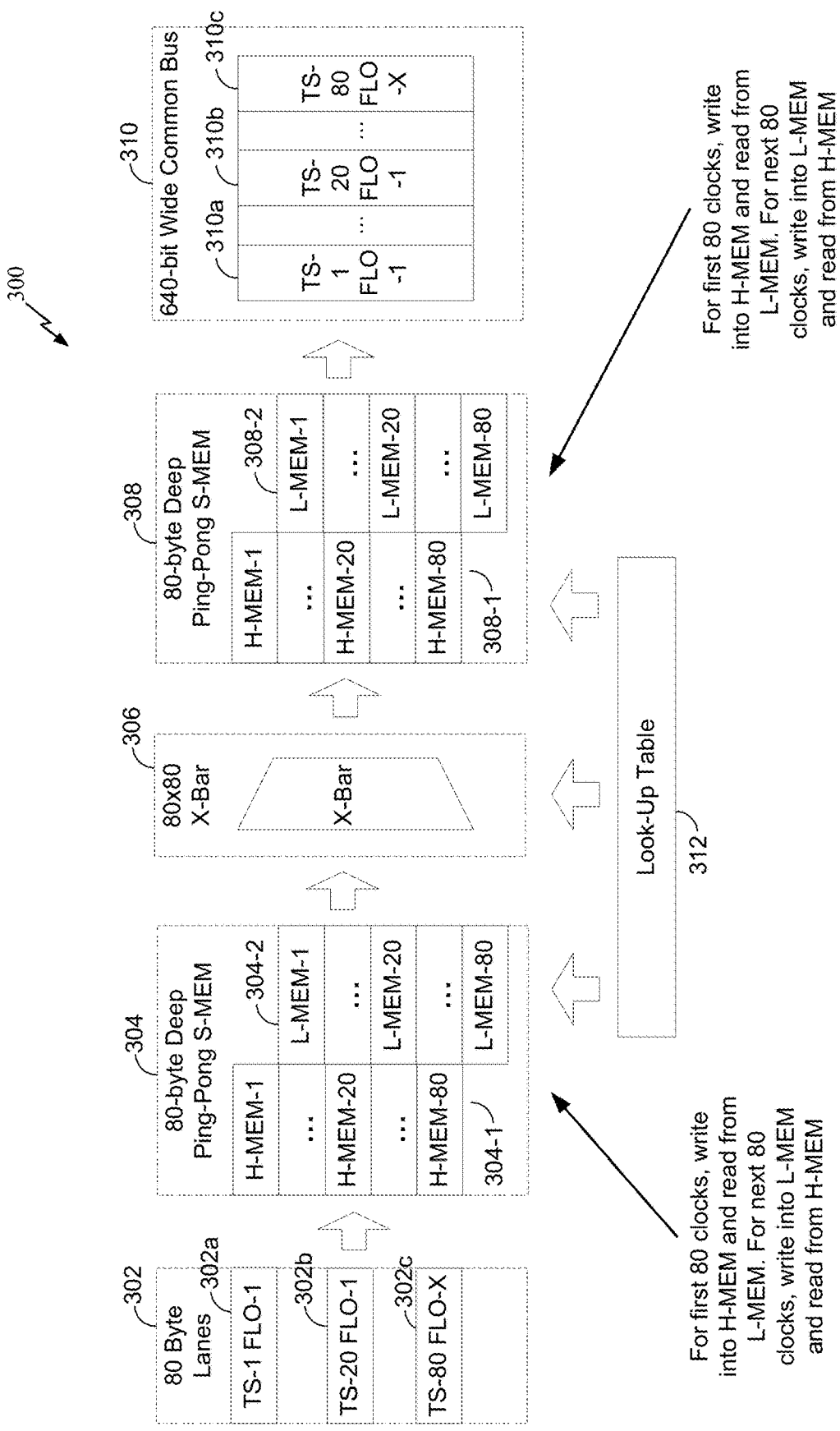
FIG. 3 illustrates an exemplary datapath for an 80 lane space-to-time data transformation in accordance with some examples of the disclosure.

FIG. 3 illustrates an exemplary datapath for a space-to-time data transformation in accordance with some examples of the disclosure. FIG. 3 uses the example of a space-to-time transformation to show how the proposed mechanism removes complexity and moves the complexity into the address generation logic, which makes the datapath design scalable.

FIG. 3 shows an example of a space-to-time transformation machine 300, which operates on 80-time slots. Space-to-time transformation machine 300 may be a specific implementation of the system 200 in FIG. 3. A set of data 302 is received in 80 byte lanes, each of which can be grouped together into independent data flows in any fashion. For example, timeslots 1 . . . N may be grouped into a first flow, and the remaining timeslots N . . . 80 may be grouped into one or more additional flows, for a total number of flows up to X flows (where N is the number of timeslots banded together to form the flow, and X≥1).

As illustrated in the example of FIG. 3, the set of data 302 includes three representative timeslots of the first and X flows. Specifically, the set of data 302 includes data from the first flow ("FLO-1") in the first timeslot ("TS-1"), referred to in FIG. 3 as TS-1 FLO-1, in data lane 302*a*, data from the first flow ("FLO-1") in the twentieth timeslot ("TS-20"), referred to in FIG. 3 as TS-20 FLO-1, in data lane 302*b*, and data from the X flow ("FLO-X") in the eightieth timeslot ("TS-80"), referred to in FIG. 3 as TS-80 FLO-X, in data lane 302*c*. The 80 bytes of the data 302 are written into an 80 byte-deep ping-pong space-memory, referred to as S-MEM 304, as they are received.

A ping-pong memory is a set of two memories that are alternately written/read. In this machine, the first memory is written to while the second memory is read from for 80 clock cycles, and after this the roles reverse, such that the data in the first memory is now read-out while the second memory is filled with data. This switch over happens every 80-clock cycles.

For the first 80 clock cycles, a first set of data 302 is written into a first, or "high," memory bank, H-MEM-1 304-1, of the S-MEM 304 and a second set of data 302 is read from a second, or "low," memory bank, L-MEM 304-2, of the S-MEM 304. For the next 80 clock cycles, a third set of data 302 is written into the L-MEM 304-2 of the S-MEM 304 and the first set of data 302 is read from the H-MEM 304-1 of the S-MEM 304.

In the example of FIG. 3, timeslots 1 . . . N of the first set of data 302 may be stored in memory slots 1 . . . N of the H-MEM 304-1, and timeslot 80 may be stored in memory slot 80 of the H-MEM 304-1. Similarly, timeslots 1 . . . N of the second set of data 302 may be stored in memory slots 1 . . . N of the L-MEM 304-2, and timeslot 80 may be stored in memory slot 80 of the L-MEM 304-2.

An advantage of the circuitry illustrated in FIG. 3 is the simplicity of implementing this scheme as a generic space to time transformation machine. As such, the specific scheme is important because it ensures that no data is missed out or gets out of order with respect to the incoming stream.

A cross-bar switch 306, which may be a specific implementation of the cross-bar switch 210 in FIG. 2, reads N rows of each flow from the S-MEM 304 every clock cycle. The cross-bar switch 306 writes N columns of each flow (but in unique rows) into an 80 byte-deep ping-pong time-memory, referred to as T-MEM 308, every clock cycle. For the first 80 clock cycles, a first set of the data 302 is written into a first, or "high," memory bank, H-MEM 308-1, of the T-MEM 308 and a second set of the data 302 is read from a second, or "low," memory bank, L-MEM 308-2, of the T-MEM 308. For the next 80 clock cycles, a third set of the data 302 is written into the L-MEM 308-2 of the T-MEM 308 and the first set of the data 302 is read from the H-MEM 308-1 of the T-MEM 308.

In the example of FIG. 3, timeslots 1 . . . N of the first set of data 302 may be stored in memory slots 1 . . . N of the H-MEM 308-1, and timeslot 80 may be stored in memory slot 80 of the H-MEM 308-1. Similarly, timeslots 1 . . . N of the second set of data 302 may be stored in memory slots 1 . . . N of the L-MEM 308-2, and timeslot 80 may be stored in memory slot 80 of the L-MEM 308-2.

In an aspect, the S-MEM 304 may be a specific implementation of the first memory 202 in FIG. 2, and the H-MEM 304-1 and the L-MEM 304-2 may be specific implementations of the first memory bank 202-1 and the second memory bank 202-2, respectively, in FIG. 2. Similarly, the T-MEM 308 may be a specific implementation of the second memory 220 in FIG. 2, and the H-MEM 308-1 and the L-MEM 308-2 may be specific implementations of the first memory bank 220-1 and the second memory bank 220-2, respectively, in FIG. 2.

At every clock cycle, 640-bits (80 words each of 8-bit) are read out of the T-MEM 308 into a 640-bit wide common bus 310 as required by a calendar sequence. Note that 80-bytes should be read from the S-MEM 304 and written into the T-MEM 308 every clock cycle. The output to the common bus 310 after the space-to-time transformation is expected to have each of the flows of data 302 occupy one or more time slices. In the example of FIG. 3, the data from the first flow in the first timeslot, i.e., TS-1 FLO-1 in lane 302*a*, the data from the first flow in the twentieth timeslot, i.e., TS-20 FLO-1 in lane 302*b*, and the data from the X flow in the eightieth timeslot, i.e., TS-80 FLO-X in lane 302*c*, may be read into the common bus 310. As illustrated in FIG. 3, the data from the first flow in the first timeslot, i.e., TS-1 FLO-1 in lane 302*a*, is read into timeslot 310*a* of the common bus 310, the data from the first flow in the twentieth timeslot, i.e., TS-20 FLO-1 in lane 302*b*, is read into timeslot 310*b* of the common bus 310, and the data from the X flow in the eightieth timeslot, i.e., TS-80 FLO-X in lane 302*c*, is read into timeslot 310*c* of the common bus 310.

The space-to-time transformation machine 300 further includes a lookup table 312, which may be a specific implementation of the lookup table 212 in FIG. 2. The lookup table 312 maintains the following control:

Space-memory read address for 80 clock cycles

Cross-bar multiplexor (mux) configuration for 80 clock cycles

Time-memory write address for 80 clock cycles

Figure 4:
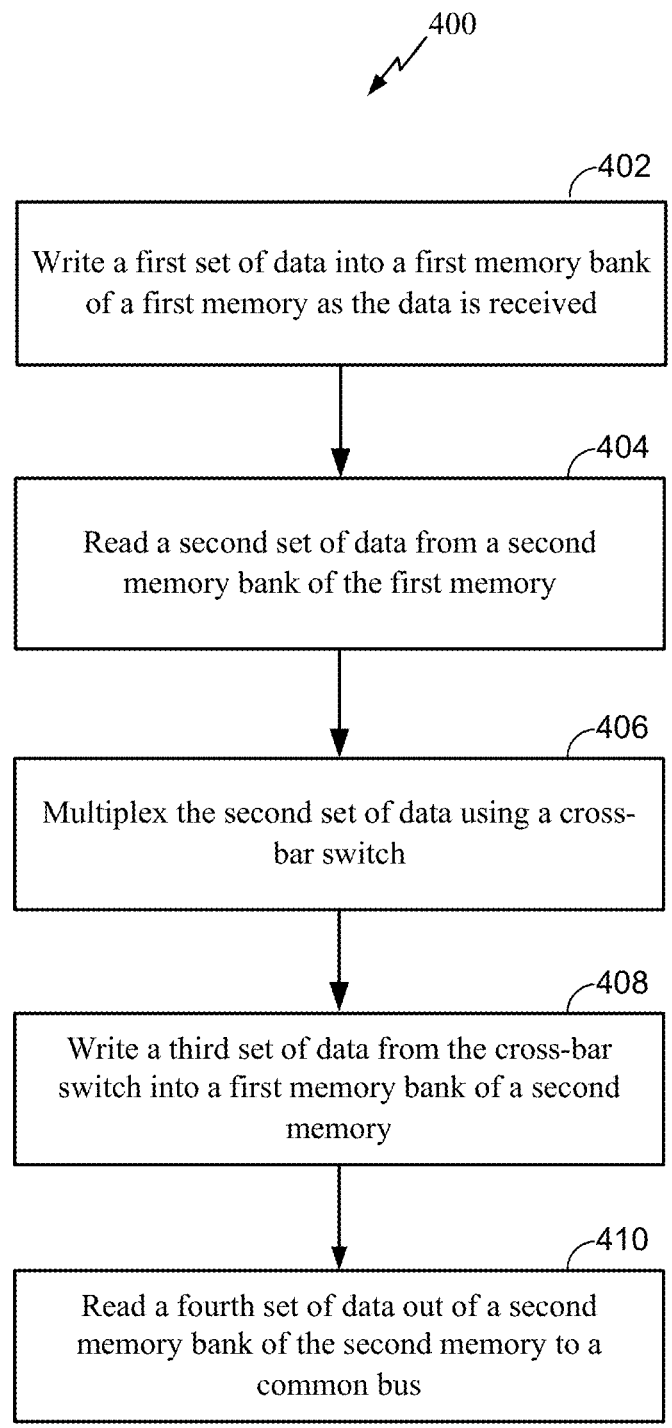
FIG. 4 illustrates an exemplary flow for a space-to-time data transformation in accordance with some examples of the disclosure.

FIG. 4 illustrates an exemplary method 400 including steps for a space-to-time data transformation in accordance with some examples of the disclosure. The method 400 may be performed in the space-to-time transformation machine 300 in FIG. 3. The method 400 may be performed in a single clock cycle, and may be performed for, for example, 80 clock cycles.

At 402, a first set of data 302 is written into the H-MEM 304-1, for example, of the S-MEM 304 as it is received. At 404, a second set of data 302 is simultaneously read out from the L-MEM 304-2, for example, of the S-MEM 304. At 406, the second set of data 302 is multiplexed using the cross-bar switch 306.

At 408, a third set of data 302 is simultaneously written from the cross-bar switch 306 into the H-MEM 308-1, for example, of the T-MEM 308. At 410, a fourth set of data 302 is simultaneously read out of the L-MEM 308-2, for example, of the T-MEM 308 to the common bus 310 using a calendar scheme that allocates periodic slots on the common bus 310 to a data flow of the data 302.

The writes and reads from the S-MEM 304 and the T-MEM 308 are controlled by the lookup table 312. The lookup table 312 controls the read address from the S-MEM 304 (as discussed above with reference to the first read address generator 208 of FIG. 2), the control for the 80×80 cross-bar switch 306 to route the data into the correct slot of the T-MEM 308 (as discussed above with reference to the cross-bar configuration component 214 of FIG. 2), and the write address into the T-MEM 308 (as discussed above with reference to second write address generator 216 in FIG. 2).

The specific implementations of the memories disclosed herein (i.e., the first memory 202, the second memory 220, the S-MEM 304, and the T-MEM 308) and the operations of the method 400 illustrated in FIG. 4 are not limited to the implementations specified in this disclosure. However, care should be taken to not corrupt the data in the memories by preventing memory access contentions, the overwriting of memory locations, and the missing of a read from memory locations.

For these reasons, in the example implementations shown in FIGS. 2 to 4 and as described above, each of the first memory 202, the second memory 220, the S-MEM 304, and the T-MEM 308 are made up of a first memory bank and a second memory bank so that there can be independent reads and writes into these memories. Specifically, when one memory bank is being written into, the other memory bank is being read out. Once the first memory bank fills up (in sync with the other memory bank emptying out), the roles are reversed and the second memory bank is now written into and the first memory bank is read. This scheme adds latency to the datapath, and therefore may not be suited to cases with very small latency requirements.

However, if the memories described herein were not divided into independent memory banks, a write and read transaction would be performed on the same memory address in the same clock cycle, which could result in incorrect data being read out from the memory. More specifically, in a single clock cycle, a byte of incoming data would be written to a given memory address, while the system would be attempting to read the byte of data that was stored at that memory address in the previous clock cycle. However, there would be no guarantee that the system would be able to read out the previously stored byte of data before the new byte of data was written to that memory address.

Figure 5:
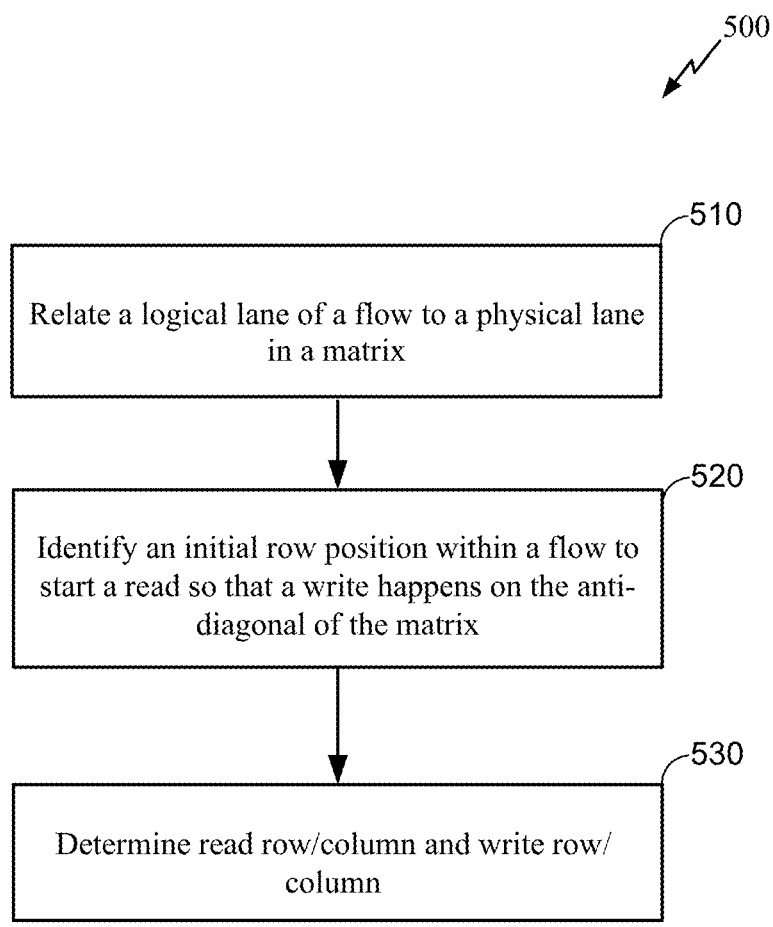
FIG. 5 illustrates an exemplary partial process for in accordance with some examples of the disclosure.

The examples below may be used in conjunction with the node 12 (including the controller 10) described in FIGS. 1A-1D and the system 200 for generic data transformation in FIG. 2 and the 80-timeslot space-to-time transformation machine 300 in FIG. 3. FIG. 5 illustrates an exemplary partial process for use with node 12 in accordance with some examples of the disclosure. The partial process 500 may be used to generate parameters for the space-time conversion of ODUx (where x can be 0, 1, 2, 3, flex) flows. For example, the parameters may be in a look up table (e.g., the lookup table 312 in FIG. 3 and/or the lookup table 720 in FIG. 7) for use by the cross-bar 306 in FIG. 3 and/or the memory based cross connect 700 of FIG. 7. The process 500 may generate sequences of read addresses for the "space" memory (e.g., the space memory 304 in FIG. 3 and/or the second memory 740 in FIG. 7), write addresses for "time" memory (e.g., the time memory 308 in FIG. 3 and/or the third memory 750), and the selects for the cross connect.

Note that if a space-memory and a time-memory are viewed as two-dimensional arrays, then the space-memory stores data from the same flow as multiple rows while the time-memory stores data from the same flow as multiple columns. This is because the space-memory stores the data as received while the time-memory stores the data as it is required to be read out.

As shown in FIG. 5, the partial process 500 starts in block 510 with relating a logical lane of a flow to a physical lane in a matrix. For example:

```
For lane L = 0 to N-1 (where N-1 is prime number);
    For flow F = 0 to Nf - 1 (where Nf is the number of distinct flows in the matrix);
        If (L = 0) Count [Nf-1:0] = 0 (i.e. reset all counts);
        If L belongs to Flow F;
            Row[F][Count[F]] = L (i.e. relate logic lane position in the flow F - Count [F] to the physical lane position);
            Count[F]= Count[F]+1.
```

Next in block 520, the partial process 500 continues with identifying an initial row position within a flow to start a read so that a write happens on the anti-diagonal of the matrix. For example:

```
Offset[Nf-1:0] = 0;
For Flow F = 0 to Nf - 1 (where Nf is the number of distinct flows in the matrix);
    For Iter = F+1 to Nf-1;
        Offset[Iter] = Offset[Iter] + Count[F];
    MaxCountF= Max (Count[Nf-1:0]);
For flow F = 0 to Nf-1;
    StartReadColumn[F] = (Offset[F] +Count[F] -1 ) DIV Count[F].
```

Next in block 530, the partial process 500 continues with determining read row/column and write row/column. For a special case where there are only two flows, one with N-1 lanes and the other with one lane:

```
If (MaxCountF = N-1) (special case where one of the flows has N-1 lanes)
    For Iteration I = 0 to N;
        For Flow F= 0 to Nf-1;
            For J= 0 to Count[F]-1;
                If( J==0);
                    NewRow = ((I+ Offset[F]) mod Count[F] );
                    ReadRow[F][J]=Row[F][NewRow];
                    ReadColumn[F][J] =(I+ Offset[F]) DIV Count[F];
                Else;
                    NewRow =((PrevRow + (N mod Count[F]
```

```
) + 1) mod count F);
                        ReadRow[F][J] = Row[F][NewRow];
                        ReadColumn[F][J] =
(ReadColumn[F][J-1]+(PrevRow+N-Count[F]+2) DIV Count[F] + ((PrevRow+N-
Count[F] +2) mod Count[F]) > 0 ) mod N;
                        If (( I==N-2) &( J== Count F-1);
                            LastReadColumn[F] =
ReadColumn[F][J];
                        If ( ( J == Count[F]-1) & (I > N-Count[F]) );
                            WriteRow[F][J] = (ReadColumn[F][J]*N +
NewRow ) mod N;
                        LogicColumn = (ReadColumn[F][J]*N +
NewRow ) DIV N;
                        WriteColumn[F][J] =
WriteColumnPos[F][LogicColumn];
                        MuxSel[WriteRow[F][J]][I] = ReadRow[F][J];
                        ReadAddress[ReadRow[F][J]][I]=
ReadColumn[F][J];
                        WriteAddress[WriteRow[F][J]][I]=
WriteColumn[F][J];
                        PrevRow= NewRow;
For all other combinations (first N-l interations):
    For Iteration I = 0 to N-2;
        For Flow F= 0 to Nf-1;
            For J= 0 to Count[F]-1;
                If(J==0);
                    NewRow = ((I+ Offset[F]+Count[F]-1)
mod Count[F] );
                    ReadRow[F][J]=Row[F][NewRow ];
                    ReadColumn[F][J] =(I+
Offset[F]+Count[F]-1) DIV Count[F];
                Else;
                    NewRow =((PrevRow + (N mod Count[F] ) - 1)
mod count F);
                    ReadRow[F][J] = Row[F] [NewRow];
                    ReadColumn[F][J] = ( ReadColumn[F][J-
1] + ( PrevRow+N -Count[F]) DIV Count[F] + (( PrevRow+N -Count[F]) mod
Count[F]) > 0 ) mod N;
                    If (( I== N-2) && ( J== Count F-1);
                        LastReadColumn[F] = ReadColumn[F][J];
                    WriteRow[F][J] = (ReadColumn[F][J]*N +
NewRow ) mod N;
                    LogicColumn = (ReadColumn[F][J]*N + NewRow ) DIV
N;
                    WriteColumn[F][J] =
WriteColumnPos[F][LogicColumn];
                    MuxSel[WriteRow[F][J]][I] = ReadRow[F][J];
                    ReadAddress[ReadRow[F][J]][I]= ReadColumn[F][J];
                    WriteAddress[WriteRow[F][J]][I]= WriteColumn[F][J];
                    PrevRow= NewRow;
For the Nth Iteration:
    For Flow F = 0 to Nf-1;
        For J= 0 to Count[F] -1;
            If( J==0);
                NewRow =((N-1+Offset[F]+Count[F]-1) mod Count[F]);
                ReadRow[F][J] = Row[F][NewRow]
            Else
                NewRow =((PrevRow + (N mod Count[F] ) - 1) mod
count F);
                ReadRow[F][J] = Row[F][NewRow];
            If (ReadRow[F][J] < StartReadRow[F] );
                ReadColumn[F][J] = StartReadColumn[F];
            Else;
                ReadColumn[F][J] = LastReadColumn[F];
            WriteRow[F][J] = (ReadColumn[F][J] *N + NewRow ) mod N;
            LogicColumn = (ReadColumn[F][J] *N + NewRow) DIV N;
            WriteColumn[F][J] = WriteColumnPos[F][LogicColumn];
            MuxSel[ WriteRow[F][J] ][I] = ReadRow[F][J];
            ReadAddress[ReadRow[F][J]][I]= ReadColumn[F][J];
            WriteAddress[WriteRow[F][J]][I]= WriteColumn[F][J];
            PrevRow=NewRow;
```

Figure 6A:
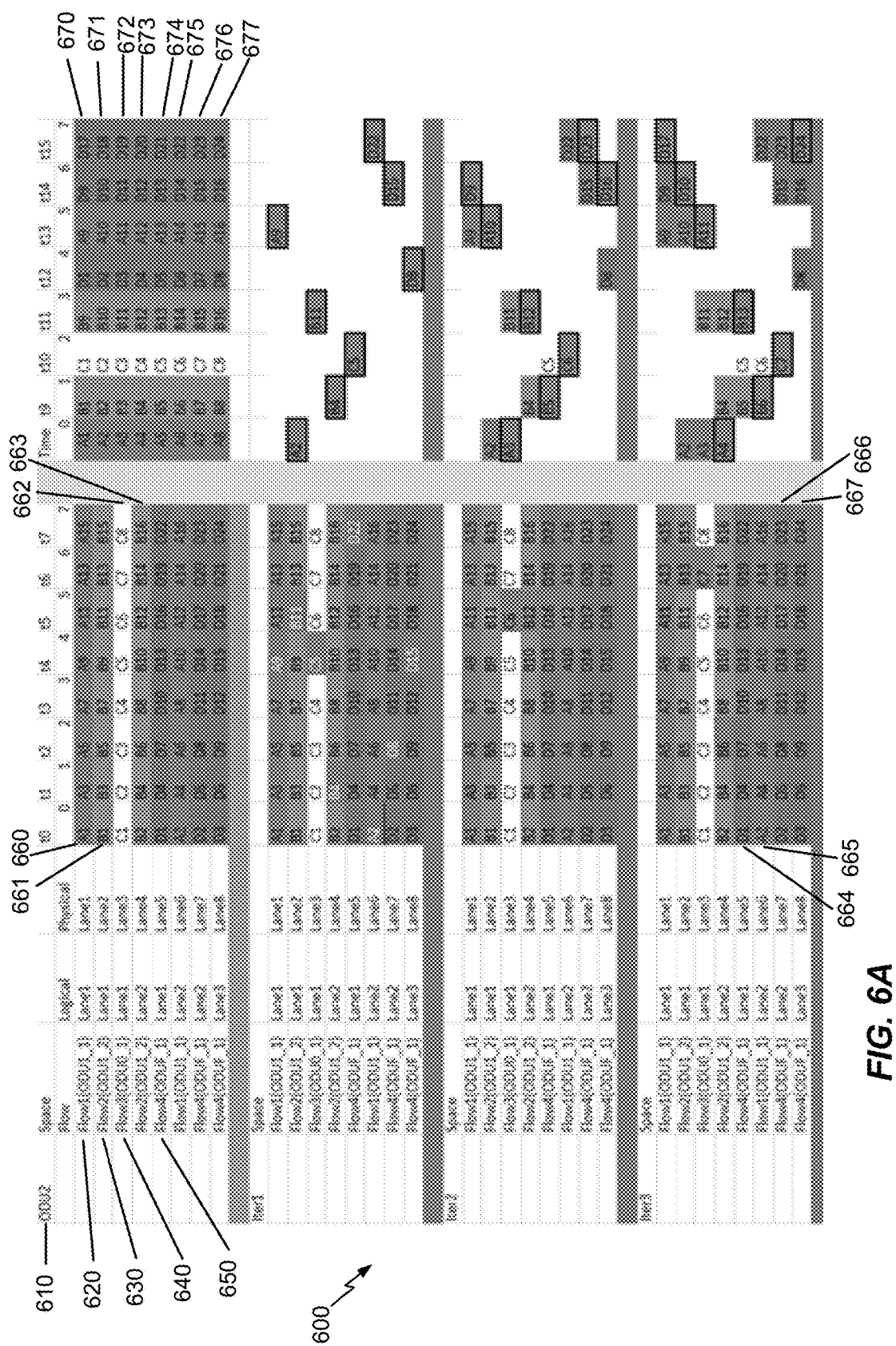
FIGS. 6A and 6B illustrate iterations of the space to time conversion in accordance with some examples of the disclosure.
Figure 6B:
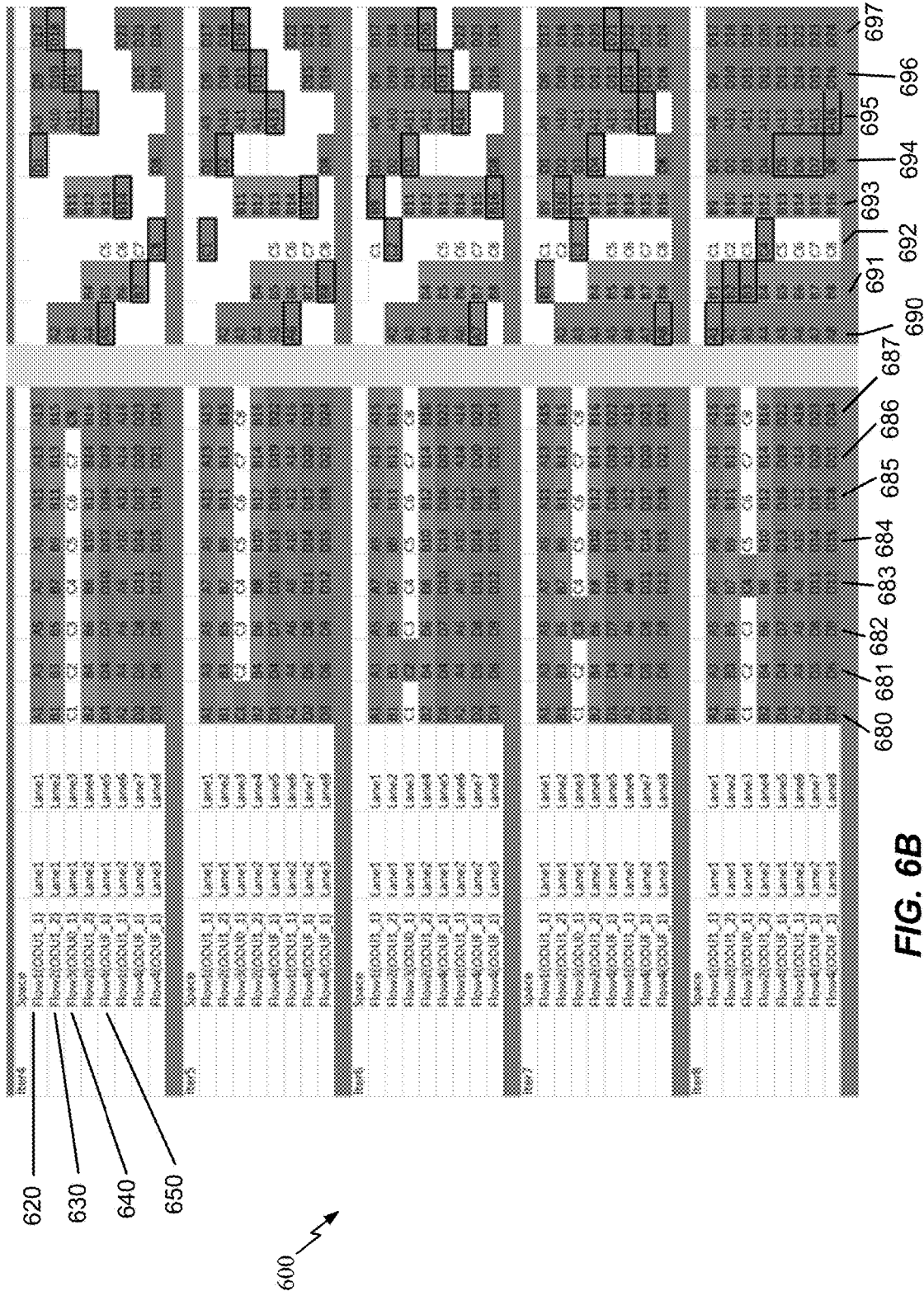

FIGS. 6A and 6B illustrate an example 600 of the partial process 500's iterations of the space to time conversion in accordance with some examples of the disclosure. In the example of FIGS. 6A and 6B, an ODU2 frame 610 with eight bytes (N) for the datapath has four (NO flows muxed: Flow 620 (Flow1)-ODU1_1 (byte 1, 6) represented by letters Ax; Flow 630 (Flow2)-ODU1_2 (byte 2, 4) represented by letters By; Flow 640 (Flow3)-ODU0_1 (byte 3) represented by letters Cz; and Flow 650 (Flow4)-ODU-Flex_1 (byte 5, 7, 8) represented by letters Dw. The rows represent separately addressable memories of a second memory 740 of FIG. 7 (rows 660-667) and a third memory 750 of FIG. 7 (rows 670-677), where each memory is a byte wide). Columns represent memory locations of the second memory 740 (columns 680-687) and the third memory 750 (columns 690-697) (for example these may represent time slots 13 of a data flow). The process 500 picks eight (N) bytes from eight different memory blocks of the second memory 740 and writes into eight different memory locations of the third memory 750, such that a space to time conversion takes place. The read and write locations per iteration are highlighted in the respective iteration. This process 500 is repeated N times so that N timeslots 13 worth of data for all the flows (NO are converted from space to time format. The initial pick per ODUx flow, for reads from the space domain, needs to ensure that the write will happen on the anti-diagonal positions of the N×N matrix of the memory locations. If rows 660-667 and the columns 680-687 of the second memory 740 are viewed as an N×N matrix and the reads (per flow) from the second memory 740 at a position on the anti-diagonal (that is diagonal which goes from lower left to upper right corner), then a simple mathematical formulation may be used to pick the next read candidate for the particular flow. It also guarantees that in N clock cycles, all the N×N entries from the second memory 740 will be read. This will ensure that the conversion can be done in N clock cycles. The process 500 may be used for all N where N−1 is a prime number (e.g. N is 8 for ODU2, 32 for ODU3, 80 for ODU4, etc.).

Figure 7:
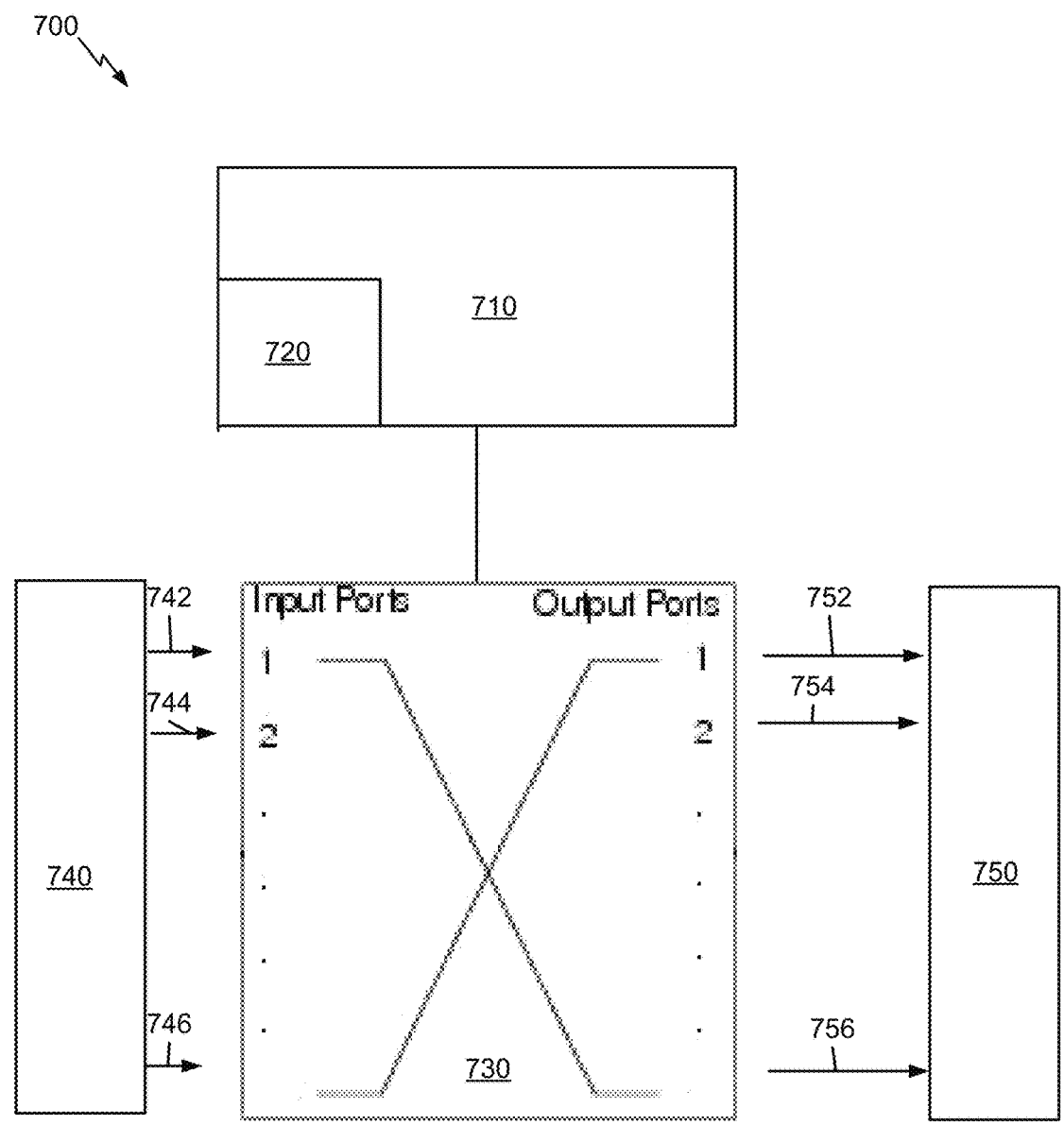
FIG. 7 illustrates an exemplary memory based cross connect in accordance with some examples of the disclosure.

FIG. 7 illustrates an exemplary memory based cross connect 700 (e.g., cross-bar 306 in FIG. 3) in accordance with some examples of the disclosure. As shown in FIG. 7, a cross connect 700 may include a first memory 710 (e.g., space memory 304 in FIG. 3) having a lookup table 720 (e.g., lookup table 312 in FIG. 3) and coupled to a cross connect switch 730 for controlling the cross connect operation of the switch 730. The switch 730 has a plurality of inputs that includes a first input 742, a second input 744, and a kth input 746, and a plurality of outputs that includes a first output 752, a second output 744, and a kth output 746. The plurality of inputs 742-746 may read from a second memory 740 configured to store data in a time based arrangement. The plurality of outputs 752-756 may write to a third memory 750 configured to store data in a space based arrangement. It should be understood that "k," the number of inputs and the number of outputs, may be any prime number plus 1.

The algorithm disclosed herein ensures that at every time instance the reads are unique (i.e., no read location is revisited in any iteration) and all N reads are performed on N distinct rows. Similarly, each write happens to a unique location (i.e., no write location is revisited in any iteration) and all N writes are performed on N distinct rows.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium (transient and non-transient) having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the examples described herein, the corresponding form of any such examples may be described herein as, for example, "logic configured to" perform the described action.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Further, those of skill in the art will appreciate that the various illustrative logical blocks, modules, circuits, and algorithm steps described in connection with the examples disclosed herein may be implemented as electronic hardware, software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus for data transformation, comprising:
    a first memory having a read port;
    a second memory having a write port;
    a third memory coupled to the first memory, the third memory receiving a first flow of first data and a second flow of second data;
    a fourth memory coupled to the second memory;
    a cross-bar switch communicatively coupled between the read port of the first memory and the write port of the second memory;
    a lookup table that specifies one or more memory addresses of the first memory to read out from the read port of the first memory to the cross-bar switch, one or more memory addresses of the second memory to which to write data from the cross-bar switch to the write port of the second memory, and a configuration of the cross-bar switch that defines writing to and reading from the cross-bar switch; and
    a common bus coupled to the fourth memory, such that the first data is supplied to the common bus over a first plurality of time slots, and the second data is supplied to the common bus over a second plurality of time slots, wherein the first and second data are subject to a space-to-time transformation.

2. The apparatus of claim 1, wherein the first memory comprises a first memory bank and a second memory bank.

3. The apparatus of claim 2, wherein:
    a first set of data received at a write port of the first memory is written to the first memory bank,
    a second set of data read from the read port of the first memory is read from the second memory bank, and
    the one or more memory addresses of the first memory comprise one or more memory addresses of the second memory bank.

4. The apparatus of claim 3, wherein the data received at the write port of the first memory is written sequentially to the first memory bank as it arrives at the write port of the first memory.

5. The apparatus of claim 3, wherein:
    a third set of data received at the write port of the first memory is written to the second memory bank after the first set of data received at the write port of the first memory is written to the first memory bank, the first set of data is read from the first memory bank after the second set of data is read from the second memory bank.

6. The apparatus of claim 1, wherein the second memory comprises a first memory bank and a second memory bank.

7. The apparatus of claim 6, wherein:
data received at the write port of the second memory is written to the first memory bank,
data read from a read port of the second memory is read from the second memory bank, and
the one or more memory addresses of the second memory comprise one or more memory addresses of the first memory bank.

8. The apparatus of claim 7, wherein the data read from the read port of the second memory is read sequentially from the second memory bank to a shared system bus.

9. The apparatus of claim 1, wherein the configuration of the cross-bar switch defines a distribution of data in the one or more memory addresses of the first memory to the cross-bar switch from the read port of the first memory and which data from the cross-bar switch is written to the one or more memory addresses of the second memory via the write port of the second memory.

10. The apparatus of claim 1, wherein:
a read address generator component coupled to the first memory reads the one or more memory addresses of the first memory from the lookup table,
a write address generator component coupled to the second memory reads the one or more memory addresses of the second memory from the lookup table, and
a cross-bar configuration component coupled to the cross-bar switch reads the configuration of the cross-bar switch from the lookup table.

11. A method for data transformation, comprising:
supplying a flow of data to a first memory;
determining, based on a lookup table, one or more memory addresses of the first memory to read out from a read port of the first memory to a cross-bar switch;
determining, based on the lookup table, one or more memory addresses of a second memory to which to write the data from the cross-bar switch to a write port of the second memory; and
determining, based on the lookup table, a configuration of the cross-bar switch that defines how the data is written to and read from the cross-bar switch,
wherein the cross-bar switch is communicatively coupled between the read port of the first memory and the write port of the second memory; and
outputting the data over a plurality of time slots to a common bus, wherein the data is subject to a space-to-time transformation.

12. The method of claim 11, wherein the first memory comprises a first memory bank and a second memory bank.

13. The method of claim 12, further comprising:
writing a first set of data received at a write port of the first memory to the first memory bank; and
reading, from the second memory bank, a second set of data read from the read port of the first memory,
wherein the one or more memory addresses of the first memory comprise one or more memory addresses of the second memory bank.

14. The method of claim 13, wherein the data received at the write port of the first memory is written sequentially to the first memory bank as it arrives at the write port of the first memory.

15. The method of claim 13, further comprising:
writing a third set of data received at the write port of the first memory to the second memory bank after the first set of data received at the write port of the first memory is written to the first memory bank; and
reading the first set of data from the first memory bank after the second set of data is read from the second memory bank.

16. The method of claim 11, wherein the second memory comprises a first memory bank and a second memory bank, the method further comprising:
writing data received at the write port of the second memory to the first memory bank; and
reading, from the second memory bank, data read from a read port of the second memory,
wherein the one or more memory addresses of the second memory comprise one or more memory addresses of the first memory bank.

17. The method of claim 16, wherein the data read from the read port of the second memory is read sequentially from the second memory bank to a shared system bus.

18. The method of claim 11, wherein the configuration of the cross-bar switch defines a distribution of data in the one or more memory addresses of the first memory to the cross-bar switch from the read port of the first memory and which data from the cross-bar switch is written to the one or more memory addresses of the second memory via the write port of the second memory.

19. The method of claim 11, wherein:
determining the one or more memory addresses of the first memory comprises reading, by a read address generator component coupled to the first memory, the one or more memory addresses of the first memory from the lookup table;
determining the one or more memory addresses of the second memory comprises reading, by a write address generator component coupled to the second memory, the one or more memory addresses of the second memory from the lookup table; and
determining the configuration of the cross-bar switch comprises reading, by a cross-bar configuration component coupled to the cross-bar switch, the configuration of the cross-bar switch from the lookup table.

20. A non-transitory computer-readable medium on which instructions are stored which, when executed by a processor of a network device in a network, cause the network device to:
receive a plurality of flows of data;
supply the data to a first memory
store one or more memory addresses of the first memory to read out from a read port of the first memory to a cross-bar switch;
store one or more memory addresses of a second memory to which to write the data from the cross-bar switch to a write port of the second memory; and
store a configuration of the cross-bar switch that defines how the data is written to and read from the cross-bar switch,
wherein the cross-bar switch is communicatively coupled between the read port of the first memory and the write port of the second memory, such that the data is supplied to a common bus over a plurality of time slots, wherein the data is subject to a space-to-time transformation.

* * * * *